(12) United States Patent
Carpenter

(10) Patent No.: US 6,356,455 B1
(45) Date of Patent: Mar. 12, 2002

(54) THIN INTEGRAL RESISTOR/CAPACITOR/ INDUCTOR PACKAGE, METHOD OF MANUFACTURE

(75) Inventor: Richard W. Carpenter, Johnson City, NY (US)

(73) Assignee: Morton International, Inc., Chicago, IL (US)

( * ) Notice: Subject to any disclaimer, the term of this patent is extended or adjusted under 35 U.S.C. 154(b) by 0 days.

(21) Appl. No.: 09/404,496

(22) Filed: Sep. 23, 1999

(51) Int. Cl.7 .................................................. H05K 1/16
(52) U.S. Cl. ..................... 361/793; 361/765; 361/766; 361/792; 361/795; 174/255; 174/256; 174/257; 174/258; 29/830; 29/832; 29/841; 29/846
(58) Field of Search ................................ 361/734, 738, 361/763, 765, 766, 748–751, 792–795, 780; 174/254–258, 250, 261; 428/213–216, 209, 901; 333/185, 246, 247; 29/830–832, 841, 846, 854; 427/96, 97

(56) References Cited

U.S. PATENT DOCUMENTS

| | | | | |
|---|---|---|---|---|
| 3,909,680 A | * | 9/1975 | Tsunashima | 361/766 |
| 3,913,224 A | * | 10/1975 | Preissinger et al. | 29/832 |
| 4,870,746 A | * | 10/1989 | Klaser | 29/830 |
| 5,144,536 A | * | 9/1992 | Tsukada et al. | 361/792 |
| 5,172,304 A | * | 12/1992 | Ozawa et al. | 361/763 |
| 5,466,892 A | * | 11/1995 | Howard et al. | 174/261 |
| 6,021,050 A | * | 2/2000 | Ehman et al. | 361/766 |

* cited by examiner

Primary Examiner—Jeffrey Gaffin
Assistant Examiner—John B. Vigushin

(57) ABSTRACT

A thin electrical circuitry structure is formed which contains conductive circuitry traces, integral capacitors and integral resistors. A first laminate structure comprises a conductive foil having a layer of embeddable dielectric material laminated thereto. A second laminate structure comprises a conductive foil having a layer of resistive material on one side, the thickness of the resistive material layer being less than that of the layer of embeddable dielectric material. The resistive material layer is circuitized to produce resistive patches, and the two structures are laminated together, embedding the resistive patches in the dielectric material layer. One of the foils is circuitized providing circuitry traces, optional inductor coils, and capacitor plates. That foil embedded in dielectric laminate to support the structure for further processing. The other foil is then circuitized providing circuitry traces, optional inductor coils and capacitor plates. Traces on one side connector with the resistive material patches to provide the resistors.

15 Claims, 2 Drawing Sheets

FIG. 1
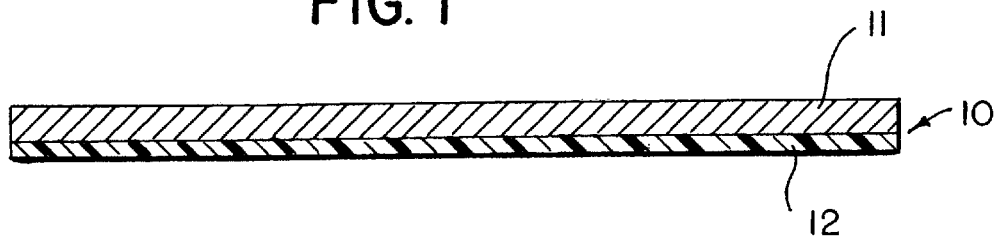
FIG. 2
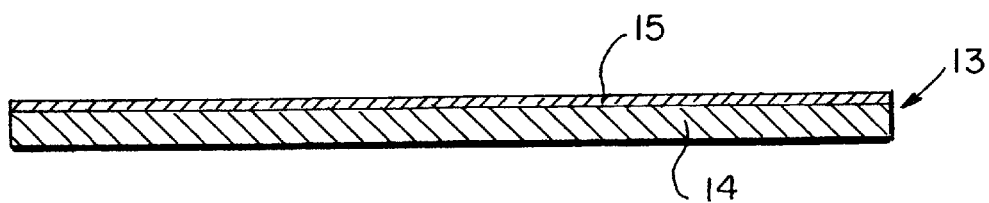
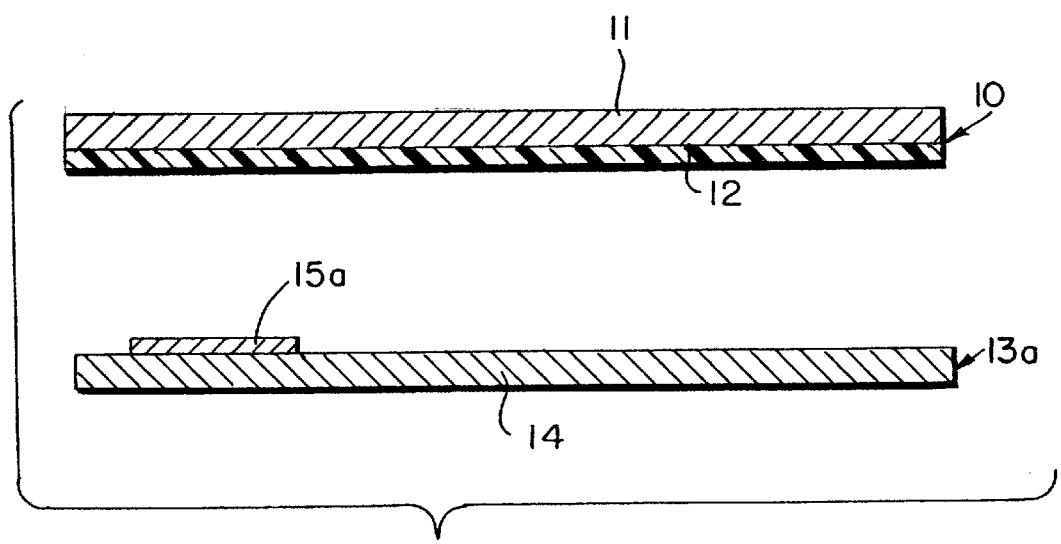
FIG. 3

THIN INTEGRAL RESISTOR/CAPACITOR/ INDUCTOR PACKAGE, METHOD OF MANUFACTURE

The present invention is directed to thin electronic circuitry which provides resistors, capacitors, interconnecting circuitry and optional inductors and to a method of manufacture of such structures.

BACKGROUND OF THE INVENTION

There is a continuing interest in printed circuitry miniaturization. In most printed circuit boards in use, circuitry traces are printed by conventional methods, particularly photoresist techniques. Accessory components such as capacitors and resistors are frequently provided as discrete components and soldered onto the printed circuitry, either manually or robotically. These components occupy "real estate" on the printed circuit board and may be difficult or expensive to apply to the board.

Accordingly, structures have been proposed in which components such as capacitors and/or resistors are provided along with circuitry traces by circuitization procedures.

Examples of such structures are found in U.S. Pat. Nos. 5,079,069, 5,155,655, 5,161,086, 5,261,153, 5,347,258, and 5,466,892, the teachings of each of which are incorporated herein by reference. Typically, a plurality of such structures are laminated together with dielectric material to form multi-layer printed circuit boards.

The present invention is directed to a method of forming a thin, circuitized laminate structure that provides capacitors, resistors, and conductive elements that include circuitry traces and optional inductors and to the thin circuitized laminate structure formed therefrom.

SUMMARY OF THE INVENTION

In accordance with the method of the invention, there is provided a first conductive metal foil to which is laminated an embeddable dielectric material layer and a second conductive metal foil which is coated on one side with a resistive material layer, the resistive material layer on the second foil having a thickness less than that of the embeddable dielectric material layer on the first foil. The resistive material layer is circuitized to form discrete patches of resistive material. Then the two structures are laminated together with the resistive material layers being embedded into the embeddable dielectric material layer without the resistive material patches contacting the first foil. At this point, either the first or the second foil is circuitized, providing interconnecting circuitry traces and optional electrical components such as inductors. To support the structure, the circuitized foil is embedded in dielectric material such as glass-filled epoxy known as "prepreg", this material supporting the structure during subsequent processing. With the structure so supported, the other foil is then circuitized and this side too may be embedded in dielectric material. Several such structures may be laminated together to form a multi-layer printed circuit board, the several layers being electrically interconnected by via holes in conventional manner.

BRIEF DESCRIPTION OF THE DRAWINGS

FIG. 1 illustrates a cross-sectional view of a first foil with a thin layer of embeddable dielectric material laminated thereto.

FIG. 2 illustrates a cross-sectional view of a second foil with a thin layer of resistive material deposited thereon.

FIG. 3 illustrates a cross-sectional view of the structure of FIG. 2 in which the resistive material on the second foil has been circuitized to form discrete resistive patches.

DETAILED DESCRIPTION OF CERTAIN PREFERRED EMBODIMENTS

Figure 4:
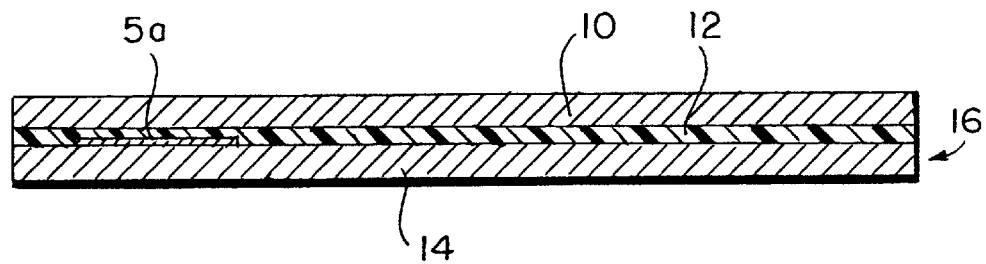
FIG. 4 illustrates a cross-sectional view of the structure of FIG. 1 laminated to the structure of FIG. 3 with the resistive material patches embedded into the embeddable dielectric material layer.

Illustrated in FIG. 1 is a structure 10 comprising a foil layer 11 to which is laminated a thin layer of dielectric material 12. Illustrated in FIG. 2 is a structure 13 comprising a foil layer 14 on which a thin layer of resistive material is deposited. The foil layers 11, 14 may be selected from a variety of metals and metal alloys, although copper foil is the most commonly used. Typically the foils 11, 14 are between about 3 and about 50 microns thick. The dielectric material layer 12 is between about 3 and about 50 microns thick. The resistive material layer 15 is between about 0.1 and about 0.5 microns thick, but in any case thinner, typically between about 2.9 and about 49.5 microns less thick than the dielectric material layer 12.

A currently preferred material used as the dielectric material layer 12 is on epoxy resin such as that sold under the trademark Dynavin.

As a first step, the resistive material layer 15 is circuitized so as to form discrete resistive layer patches 15a on the second foil 14 to form structure 13a of FIG. 3. (For simplification of illustration, only one such resistive patch 15a is shown.) Circuitization of the resistive layer 15 is closely analogous to conventional circuitization of conductive to form printed circuitry traces. The resistive layer 15 is covered with a photoresist (described herein terms of a negative-acting photoresist); the photoresist is exposed through artwork to actinic radiation; unexposed portions of the photoresist are developed away, and exposed portions of the underlying resistive material layer 15 are etched away.

U.S. patent application Ser. No. 09/198,954, the teachings of which are incorporated herein by reference, teaches a preferred resistive material for forming layer 15. This patent application teaches that platinum containing relatively small amounts of a dielectric, such as silica, has substantial electrical resistivity, depending upon the amount of the dielectric, typically ranging from about 0.5 wt % to about 5.0 wt %. A thin layer of silica-doped platinum is conveniently deposited by combustion chemical vapor deposition (CCVD) a process described in U.S. Pat. No. 5,652,021, the teachings of which are incorporated herein by reference. CCVD-deposited Pt/SiO$_2$ has substantial porosity, making it possible to remove selected portions of a Pt/SiO$_2$ from copper foil in a process described in above referenced U.S. patent application Ser. No. 09/198,954 as ablative etching. The exposed portions of the Pt/SiO$_2$ layer are exposed to a copper etchant, such as ferric chloride. The etchant seeps through the Pt/SiO$_2$ layer, attacking the copper at the interface between the two layers. It is found that the Pt/SiO$_2$ layer ablates away when adhesion is lost before the underlying copper layer is significantly degraded. In this manner a Pt/SiO$_2$ layer on copper (or other foils) may be circuitized.

As a refinement on this process, a very thin etchant-sensitive layer, e.g., nickel, (not shown) may be deposited either by CCVD or by electroplating on the copper foil before the $Pt/SiO_2$ layer is deposited. When an etchant seeps through the $Pt/SiO_2$ layer, it rapidly erodes the etchant-sensitive layer to facilitate the ablative etching process.

At this time, structure 10 having the dielectric material layer 12 on the first foil 11 is laminated bto structure 13a by pressing the resistive material patches 15a side into the dielectric material 12, embedding the patches 15a into the dielectric material to form structure 16 of FIG. 4. Because the dielectric material layer 12 is somewhat thicker than the resistive patches 15a, the patches 15a remain electrically isolated from the first foil 11 by a thinned portion of the dielectric material layer 12.

Figure 5:
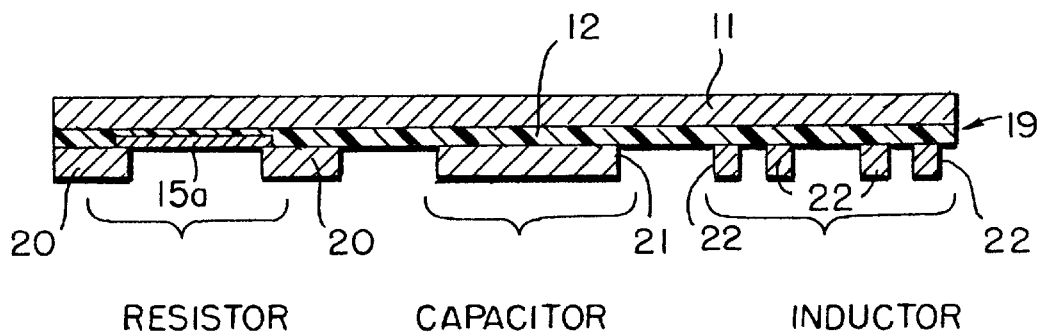
FIG. 5 illustrates a cross-sectional view of the structure of FIG. 4 in which the second foil layer has been circuitized.

Next, the second foil layer 14 is circuitized by conventional photoresist circuitization techniques to form structure 19 having circuitry elements 20, 21 and 22 shown in FIG. 5. (The process could be similarly practiced by first circuitizing the first foil layer 11 and later circuitizing the second foil layer 14.) Elements 20 represent conductive connecting traces at opposite ends of resistive patch 15a. A resistive electrical pathway is thereby formed between the connecting traces 20 through resistive patch 15a; 15a/20 as a unit thereby acting as a resistor. Element 21 represents one conductive plate of a capacitor, capacitance to be built up between element 21 and a similar plate to be later formed by circuitization of the first foil layer 11. Elements 22 represent printed electrical coils which serve as electrical inductors.

Figure 6:
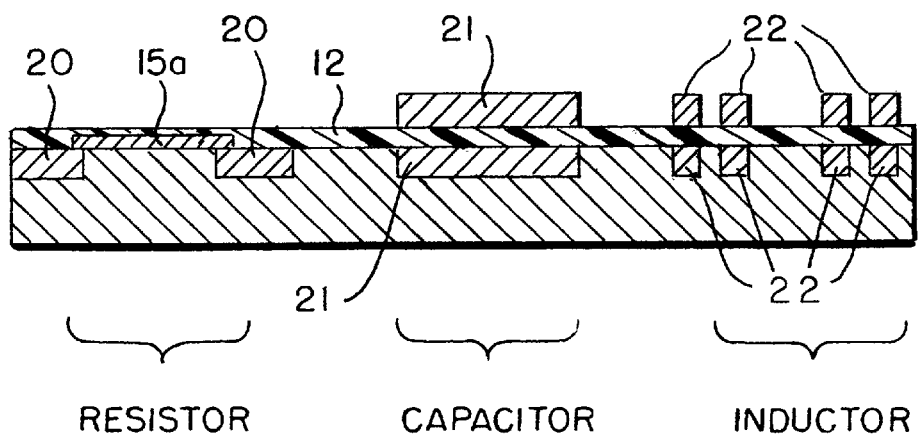
FIG. 6 illustrates a cross-sectional view of a structure in which the circuitized second foil layer has been embedded into a dielectric material and the first foil layer has subsequently been circuitized.

The thin dielectric material layer 12 has substantially no mechanical strength. Accordingly, before structure 19 can be further processed, the circuitized side of structure 19 is embedded in a layer of laminate dielectric 26 which mechanically supports the structure as seen in FIG. 6. Then the first foil layer is circuitized to form circuitry traces, capacitor plates 21 and inductor coils 22. This circuitized side is subsequently embedded in a further layer of laminate dielectric (not shown). A plurality of such structures may be laminated together to form a multi-layer printed circuit board in which via holes are formed and plated in conventional manner to form electrical connections between the multi-layers.

The invention will now be described in greater detail by way of specific examples.

EXAMPLE 1
Formation of Structure 10 as per FIG. 1.

A 50 micron thick copper foil is laminated to a 50 micron sheet of Dynavin which acts as an embeddable dielectric material layer 12.

EXAMPLE 2
Formation of Structure 13 as per FIG. 2

To a 50 micron thick copper foil there is deposited by electroplating a 3.5 micron layer of nickel. A 0–15 micron thick $Pt/SiO_2$ (97.5:2.5 by wt.) layer was deposited by CCVD under the following deposition conditions:

| Solution Preparation | 1.23 g. Pt (COD)* | |
|---|---|---|
| | 250 ml. toluene | |
| | 0.43 g TEOS** (1.5 wt % Si in toluene) | |
| | 150 g propane | |
| Deposition conditions | Solution flow | 3 ml/min |
| | Deposition time: | 1 hour |
| | Deposition temp | 500° C. |

-continued

| | | |
|---|---|---|
| Variac | 3.0 A | |
| Tip oxygen flow | 2900 ml/min | |

*diphenyl-(1,5-cyclooctadiene) platinum II
**tetraethoxysilane

EXAMPLE 3
Formation of the Printed Circuitry

The structure produce in Example 2 is covered on both sides with Laminar® 5000 photoresist. The $Pt/SiO_2$ side is exposed to patterned actinic radiation and the foil side fully exposed to actinic radiation. The structure is then developed in 2% sodium carbonate at 80° C. to remove unexposed resist areas from the resistive material side. With exposed resist protecting the copper foil, the structure is exposed to a cupric chloride solution for a time sufficient for the solution to penetrate the $Pt/SiO_2$ and degrade the nickel layer sufficiently for the exposed portions of the $Pt/SiO_2$ to ablate away. Then the resist is stripped with NaOH solution. This etched structure is then laminated to the structure of FIG. 1, embedding the remaining $Pt/SiO_2$ portions into the dielectric material.

Both foil layers are then coated with photoresist. The foil layer with the $Pt/SiO_2$ is exposed to patterned actinic radiation; the other foil layer fully exposed to protect the same during processing. The structure is developed in sodium carbonate as above, and the exposed portions of the one foil layer are etched with a ferric chloride solution to form circuitry traces, capacitor plates, resistor connections, and inductor coils. Then the resist is stripped from both sides of the structure.

The circuitized foil layer is embedded in laminate dielectric.

The other foil layer is then circuitized as before, forming circuitry traces, capacitor plates, and inductor coils.

What is claimed is:
1. An embedded electrical circuitry structure comprising in order:
   an epoxy dielectric layer;
   a first circuitized layer of electrically conductive material;
   a patterned layer of electrically resistive material having patches of resistive material in contact with the first circuitized layer of conductive material such that resistor electrical pathways are formed through the patches of the resistive material;
   a layer of embeddable dielectric material having a thickness greater than that of the layer of resistive material such that the patches of resistive material are embedded in the embeddable dielectric material; and
   a second circuitized layer of electrically conductive material; wherein capacitor electrical pathways are defined between the first and second circuitized layers of electrically conductive material through the layer of embeddable dielectric material.
2. The structure of claim 1 wherein the second circuitized layer is further embedded in an epoxy layer.
3. The structure of claim 1 wherein the embeddable dielectric material layer is an epoxy resin.
4. The structure of claim 1 wherein the resistive material layer is comprises platinum doped with a dielectric material.
5. The structure of claim 1 wherein each of the first and second circuitized layers of conductive material is between about 3 and about 50 microns thick.
6. The structure of claim 1 wherein the resistive material layer is between about 0.1 and about 0.5 microns thick; the embeddable dielectric material layer is between about 3 and about 50 microns thick, and the embeddable dielectric material layer is between about 2.9 and about 49.5 microns thicker than the electrically resistive material layer.

7. A method for forming a circuitized laminate structure comprising circuitry traces, integral resistors and capacitors comprising the steps of:

provuding a first structure comprising a conductive first metal foil and a layer of embeddable dielectric material laminated thereto;

providing a second structure comprising a second metal foil having a layer of a resistive material on one side of the foil, the resistive material layer having a thickness less than that of the layer of embeddable dielectric material;

circuitizing the layer of resistive material to provide discrete resistive material patches on the second metal foil;

laminating the first structure and the circuitized second structure so as to embed the resistive material patches in the layer of embeddable dielectric material;

circuitizing either the first or second metal foils;

embedding the circuitized metal foil into a dielectric material support; and circuitizing the remaining metal foil;

wherein the first metal foil is circuitized to form one or more of capacitor plates, circuitry traces, and inductor coils and wherein the second metal foil is circuitized to form resistor connections.

8. The method of claim 7 further comprising the step of embedding the circuitized remaining foil in a dielectric material support.

9. The method of claim 7 wherein each of the first and second foil layers is between about 3 and about 50 microns thick.

10. The method of claim 7 wherein the resistive layer is between about 0.1 and about 0.5 microns thick; the embeddable dielectric material layer is between about 3 and about 50 microns thick, and the embeddable dielectric material layer is between about 2.9 and about 49.5 microns thicker than the electrically resistive material layer.

11. The method of claim 7 wherein the first and second foils are copper.

12. The method of claim 7 wherein the embeddable dielectric material is epoxy.

13. The method of claim 7 wherein the resistive material layer comprises platinum doped with a dielectric material.

14. The method of claim 7 wherein the circuitized second metal foil further comprises one or more of capacitor plates, circuitry traces or inductor coils.

15. A method for forming a multi-layer printed circuit board comprising the step of laminating a plurality of circuitized laminate structures, each circuitized laminate structure comprising circuitry traces, integral resistors and capacitors, and each circuitized laminate structure prepared by a method comprising the steps of:

providing a first structure comprising a conductive first metal foil and a layer of embeddable dielectric material laminated thereto;

providing a second structure comprising a second metal foil having a layer of a resistive material on one side of the foil, the resistive material layer having a thickness less than that of the layer of embeddable dielectric material;

circuitizing the layer of resistive material to provide discrete resistive material patches on the second metal foil;

laminating the first structure and the circuitized second structure so as to embed the resistive material patches in the layer of embeddable dielectric material;

circuitizing either the first or second metal foils;

embedding the circuitized metal foil into a dielectric material support; and circuitizing the remaining metal foil;

wherein the first metal foil is circuitized to form one or more of capacitor plates, circuitry traces, and inductor coils and wherein the second metal foil is circuitized to form resistor connections.

* * * * *